United States Patent
Sin

(10) Patent No.: US 6,833,047 B2
(45) Date of Patent: Dec. 21, 2004

(54) ALARM APPARATUS FOR EXCHANGING LAMPS OF WAFER ETCHING EQUIPMENT

(75) Inventor: Il Kwon Sin, Kyounggi-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 60 days.

(21) Appl. No.: 10/098,287

(22) Filed: Mar. 18, 2002

(65) Prior Publication Data

US 2003/0071017 A1 Apr. 17, 2003

(30) Foreign Application Priority Data

Oct. 11, 2001 (KR) .................................. 2001-62564

(51) Int. Cl.$^7$ ............................ H05H 1/00; C23C 16/00
(52) U.S. Cl. ............................ 156/345.24; 156/345.5; 118/712
(58) Field of Search .................. 156/345.5, 345.28, 156/345.24; 118/712, 641, 724; 216/59, 63, 61

(56) References Cited

U.S. PATENT DOCUMENTS 5,445,675 A * 8/1995 Kubodera et al. ........... 118/719
6,396,216 B1 * 5/2002 Noone et al. ................ 315/119
6,483,260 B1 * 11/2002 Flory, IV ..................... 315/325

* cited by examiner

Primary Examiner—Parviz Hassanzadeh
(74) Attorney, Agent, or Firm—Volentine Francos & Whitt, PLLC

(57) ABSTRACT

There is provided an alarm apparatus for checking an amount of electric current supplied to each of the lamps of a wafer etching equipment and timely exchanging defective lamps if the amount of the current is less than a predetermined level, thereby minimizing process failures. The alarm apparatus includes a plurality of lamps provided above a dome cover of a reaction chamber to uniformly maintain a constant temperature of the dome cover, current quantity detecting devices provided on each of electric lines supplying electric power to each of the lamps, a controller for checking the amount of electric current through each of the current quantity detecting devices to compare the detected amount of electric current with a predetermined amount of electric current, and an alarm indicating a proper time to exchange lamps having an amount of electric current less than the predetermined amount of electric current in response to a comparison result from the controller.

2 Claims, 5 Drawing Sheets

ALARM APPARATUS FOR EXCHANGING LAMPS OF WAFER ETCHING EQUIPMENT

CROSS REFERENCES TO RELATED APPLICATIONS

This application claims the benefit under 35 U.S.C. §119 of Korean Patent Application No. 2001-0062564, filed on Oct. 11, 2001, the entirety of which is hereby incorporated herein by reference for all purposes as if fully set forth herein.

BACKGROUND OF THE INVENTION

1) Technical Field

The present invention relates to an alarm apparatus for exchanging lamps of a wafer etching device and a method therefor, and more particularly, to an alarm apparatus for exchanging lamps of a wafer etching device, and a method for detecting disconnected lamps and the expected life span of a plurality of lamps that are provided in a semiconductor exposure apparatus to exchange the corresponding lamps, thereby minimizing process failures.

2) Description of Related Art

Fabricating semiconductor devices generally requires various process equipment such as diffusion equipment, deposition equipment, ion implantation equipment, etching equipment, and the likes. Dry etching equipment and dry stripping equipment, out of the etching equipment for accurately patterning wafers, are provided in their chambers with a plurality of lamps for allowing polymers to be attached to dome shaped covers of the chambers.

A lot of polymer particles float in an ascending current in the chamber while a stripping process is performed to remove a photo-resist layer on a wafer, or while an etching process is performed to pattern a wafer. At this time, the dome shaped cover serves to prevent these polymer particles from being deposited on a wafer.

FIG. 1 is a vertical cross sectional view of conventional dry etching equipment.

Referring to FIG. 1, a reaction chamber 1 is provided therein with an electrostatic chuck 2 on which a wafer W is loaded, supplied at its one side with a process gas, and the residual gas in the chamber 1 is pumped out just after processes complete. The reaction chamber 1 is covered at its topside with a transparent dome cover 3 and the topside is provided with a RF power coil 4, which serves to change the process gas to plasma type gas, and with a plurality lamps 5.

The etching equipment is generally provided therein with about eight lamps and the stripping equipment is provided therein with about 14 lamps.

The lamp 5 is designed to expose a wafer and accordingly emits heat at a temperature of about 80° C. in the etching equipment and emits heat at a temperature of 275° C. in the stripping equipment. It is very important for lamps of the etching equipment to maintain a proper temperature when heat is emitted therefrom, because particles created in the reaction chamber 1 are evenly diffused and adhere onto the dome cover 3 only when the chamber 1 continuously maintains a proper temperature above a predetermined temperature.

If a portion of the plurality of lamps fails in its function or is turned off, the adhesion distribution of the particles to the dome cover becomes uneven due to the variation in the surface temperature of the dome cover. As a result, there is a problem in that the particles in the reaction chamber 1 come off and are deposited on a wafer W, resulting in defective wafers.

In addition, there is a problem in the conventional alarm apparatus in that the state of the lamps (that is, whether the lamps are disconnected) cannot be checked without opening the upper cover of the alarm apparatus.

SUMMARY OF THE INVENTION

To solve the problems as described above, it is an object of the present invention to provide an alarm apparatus for checking an amount of electric current supplied to each of the lamps and timely exchanging only defective lamps if the amount of the current is less than a predetermined level, thereby minimizing process failures.

It is another object of the present invention to provide an alarm apparatus by which a worker can check whether lamps of a wafer etching equipment are electrically connected or disconnected without opening an upper cover of the equipment.

According to an aspect of the present invention, an apparatus comprises a plurality of lamps provided above a dome cover of a reaction chamber to uniformly maintain a constant temperature of the dome cover, current quantity detecting devices provided on each of electric lines supplying electric power to each of the lamps, a controller for checking the amount of electric current through each of the current quantity detecting devices to compare the detected amount of electric current with a predetermined amount of electric current, and an alarm indicating a proper time to exchange lamps having an amount of electric current less than a predetermined amount in response to a comparison result produced by the controller.

According to another aspect of the present invention, an apparatus comprises a plurality of lamps provided above a dome cover of a reaction chamber to uniformly maintain a constant temperature of the dome cover, coils winding around electric wires supplying electric power to each of the lamps so that electric current induced by each of the electric wires flows therein, electromagnetic resistance devices for converting the induced current values in the coils to resistance values to thereby detect the resistance values, a controller for checking the resistance values detected by the electromagnetic resistance devices to compare each with a predetermined resistance value, and an alarm indicating a time to replace lamps in response to a signal that is generated by the controller.

BRIEF DESCRIPTION OF THE DRAWINGS

The foregoing and other objects, aspects and advantages will be better understood from the following detailed description of preferred embodiments of the invention with reference to the drawings, in which.

DETAILED DESCRIPTION OF PREFERRED EMBODIMENTS

Figure 1:
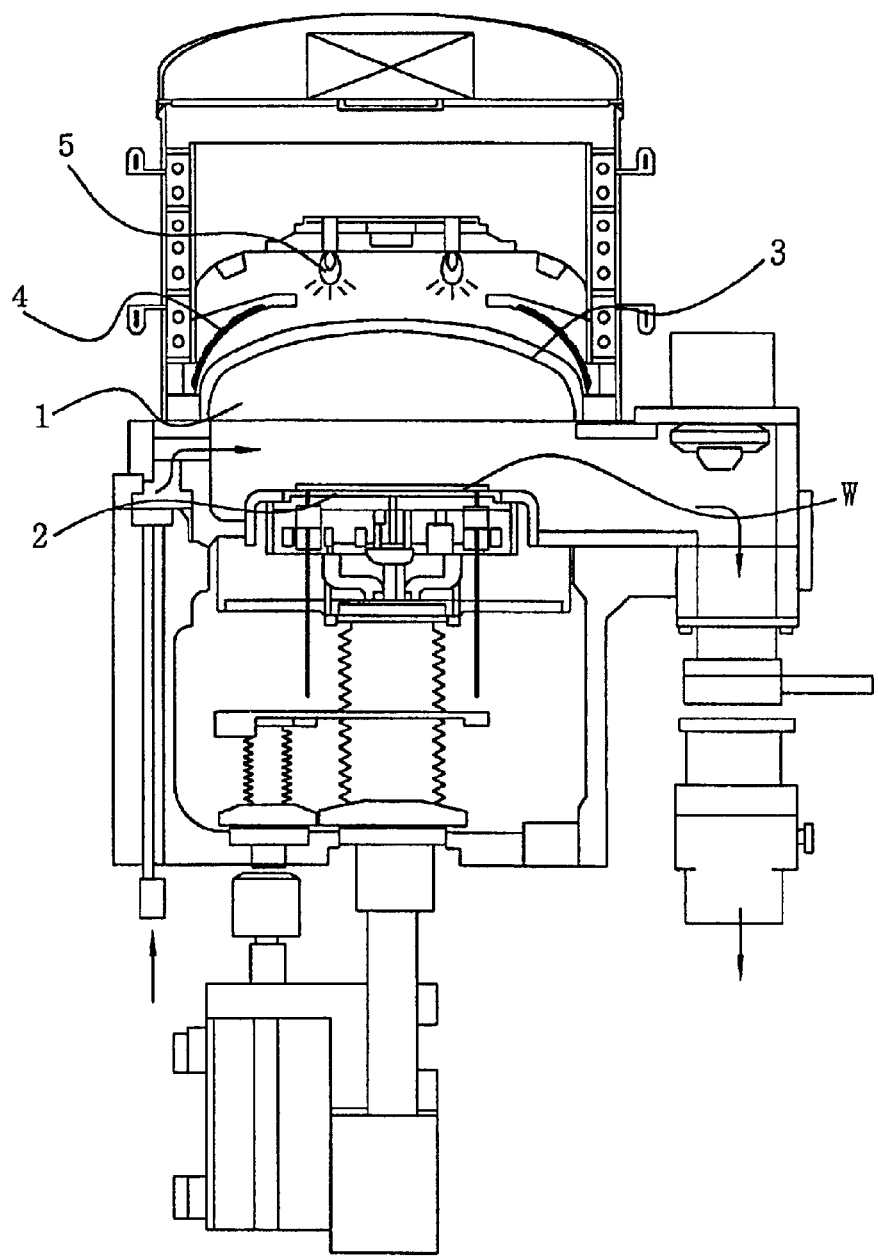
FIG. 1 is a vertical sectional view showing a conventional prior art wafer etching equipment.

In the following description, the same reference numerals are used to denote similar or equivalent parts or portions. In addition, specifications will be made to provide a thorough understanding of the present invention, although it is readily apparent to one skilled in the art that the present invention can be achieved without the specifications. A detailed description of well-known functions and structures will be omitted so as to clarify key points of the present invention.

The present invention is directed to an alarm apparatus that informs a worker of a time to exchange one or more lamps for heating a dome cover of a chamber to a predetermined temperature, which can be commonly applied to dry etching equipment and stripping equipment.

Figure 2:
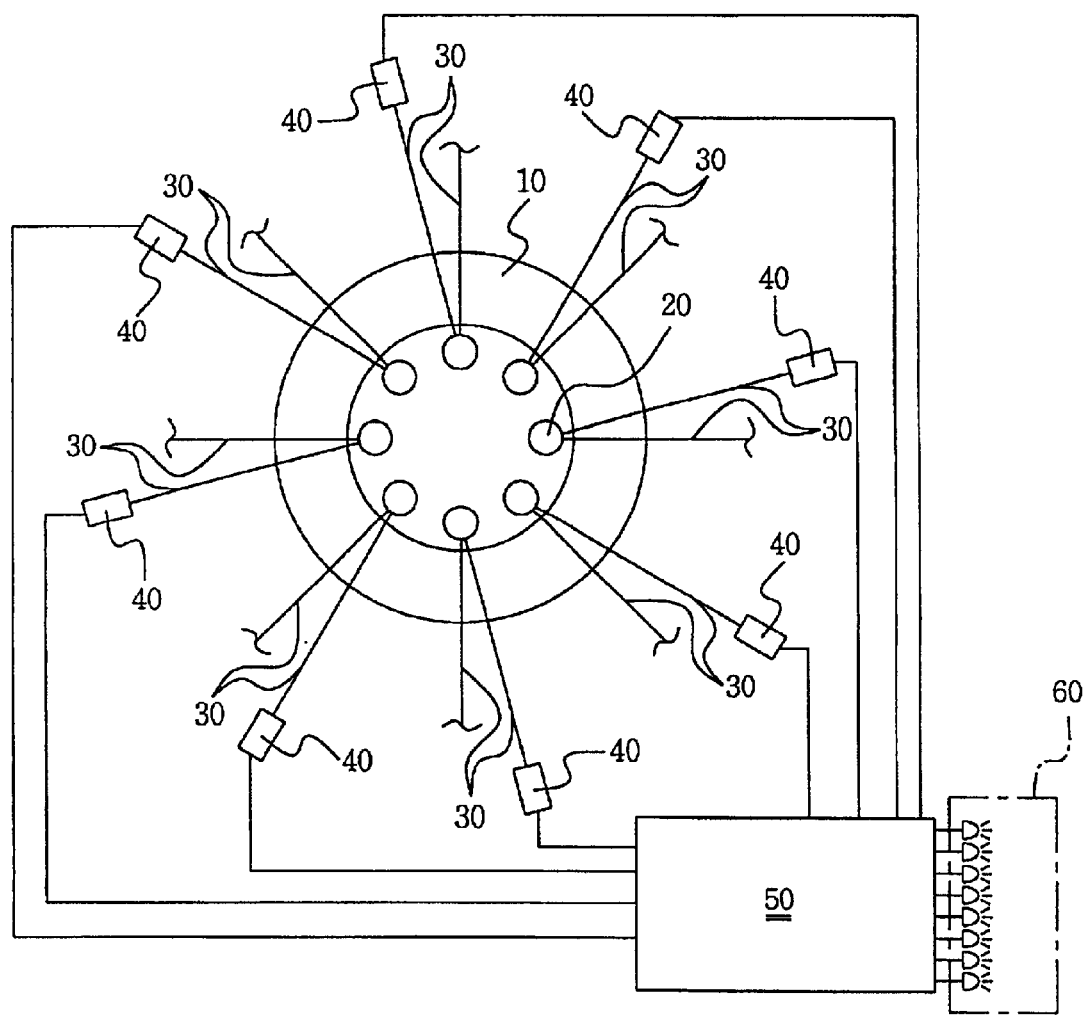
FIG. 2 is a schematic main part plan view of a structure of one embodiment of an alarm apparatus.

FIG. 2 is a schematic main part plan view of a structure of one embodiment of an alarm apparatus.

Referring to FIG. 2, a plurality (e.g., eight) of lamps 20 are provided over the dome cover 10 to heat it up to a predetermined temperature. Each of the lamps 20 is connected to corresponding electric wires 30 that supply electric power to each of the lamps 20. Each one of the wires 30 is connected to a current quantity detecting device 40 for detecting an amount of electric current that is applied to a corresponding one of the lamps 20 through the wires 30.

Each of the current quantity detecting devices 40 is connected to a controller 50. The controller 50 checks the amount of current that is applied to each of the lamps 20. The controller 50 is provided with an alarm 60. The alarm 60 allows a worker to determine at the outside whether each of the lamps 20 properly operates by checking the amount of electric current that is supplied to each of the lamps 20. The alarm 60 is formed of the same number of alarm elements as that of the lamps 20. Each of the alarm elements is connected to a corresponding one of the lamps 20. The alarm may be a lamp or a light emitting diode (LED). A worker can determine whether the lamps 20 are electrically disconnected by checking the state of each of the alarms at the outside and determine whether to exchange the disconnected lamp 20 based on the information.

Figure 3:
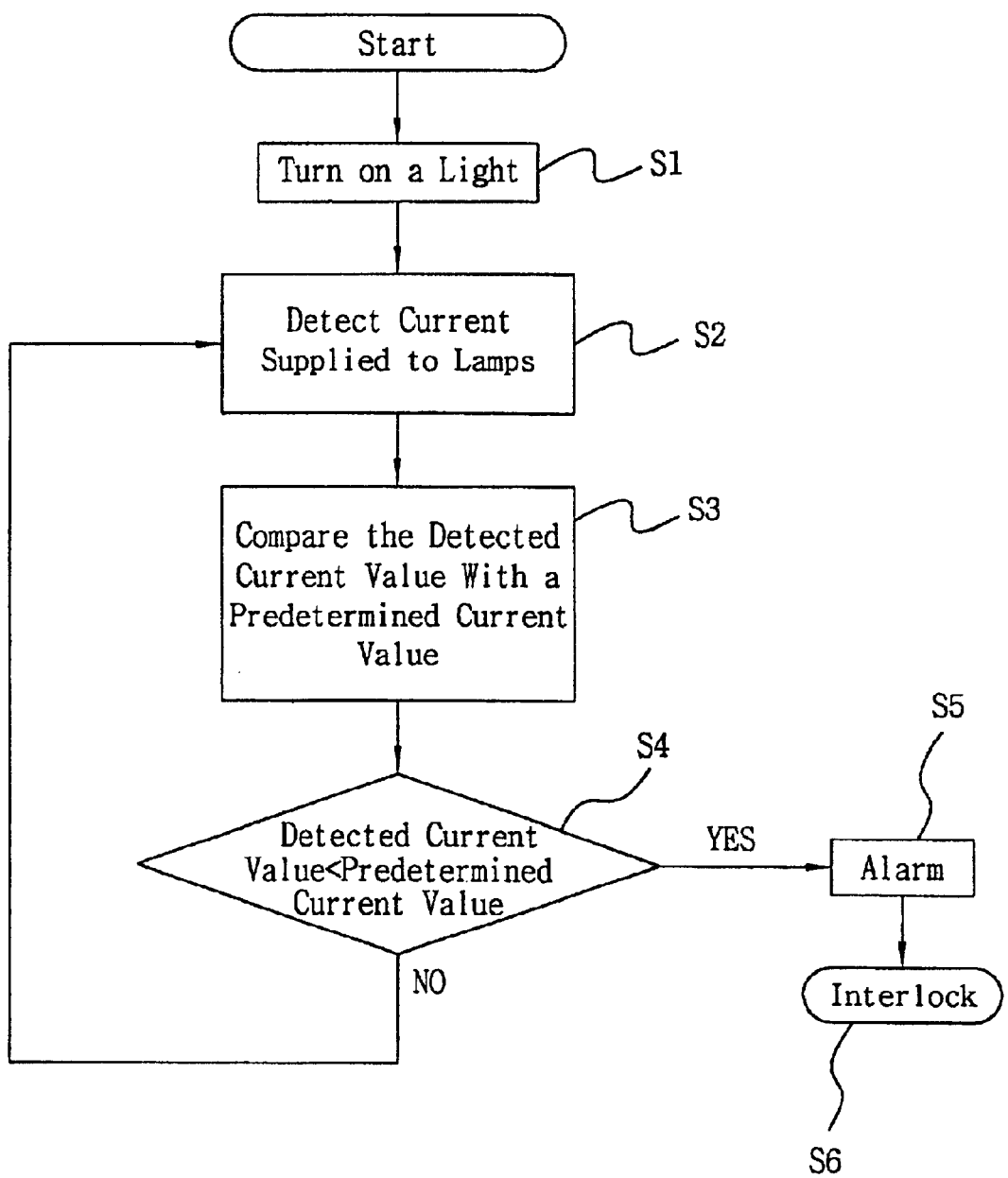
FIG. 3 is a flow chart for controlling the structure shown in FIG. 2.

The confirmation that it is time to exchange one of more of the lamps 20 can be made according to the flow chart of FIG. 3.

When the lamps 20 are turned on while semiconductor-fabricating processes are performed (S1), each of the current detecting devices 40 detects the amount of electric current supplied to each of the lamps 20 (S2). The information concerning the amount of the current that is detected by each of the current detecting devices 40 is transferred to the controller 50.

Since the controller 50 is already provided with a set minimum amount of current that is necessary for the lamps 20 to properly heat up the dome cover 10 to a predetermined temperature, the controller 50 compares the detected amount of current with the set amount of current (S3).

If the comparison between the detected current and the set current indicates that the detected amount of current is more than the set amount of current, then the controller 50 returns to the step (S2) in which the current detecting devices 40 detect the amount of current, and the controller 50 continues to compare the detected amount of current with the set amount of current. Meanwhile, result of the comparison between the detected current and the set current indicates that the detected amount of current is less than the set amount of current, then the controller 50 immediately operates the alarm 60 (S5). The alarm 60 is preferably formed of a plurality of LEDs that are directly viewed by a worker so that disconnected lamps or any defective lamps are separately detected and may thereby be exchanged immediately.

If any defective lamp(s) are detected through the alarm 60, the controller 50 interlocks the process equipment, thereby allowing the defective lamp(s) to be timely exchanged.

In addition, if any lamp(s) 20 in which electric current flows in an amount less than a predetermined amount are detected, the controller 50 also stops operation of the process equipment.

Particularly, if the number of the defective lamps 20 is great, or if the period in which the defective lamps 20 are checked is becoming short, it is desirable that the whole set of lamps 20, including even the normal lamps 20, are exchanged to thereby have the same exchange time.

Figure 4:
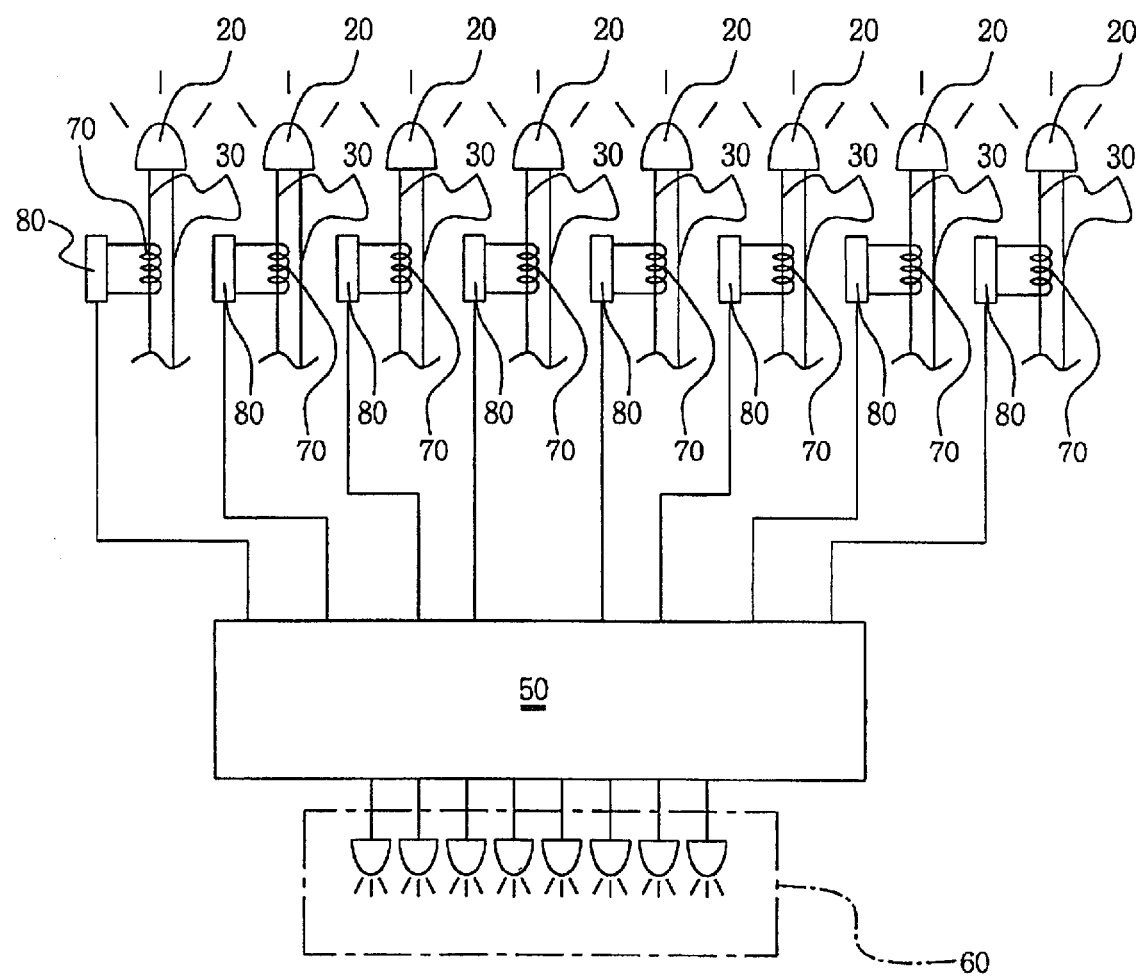
FIG. 4 is a schematic main part plan view of a structure of another embodiment of an alarm apparatus.
Figure 5:
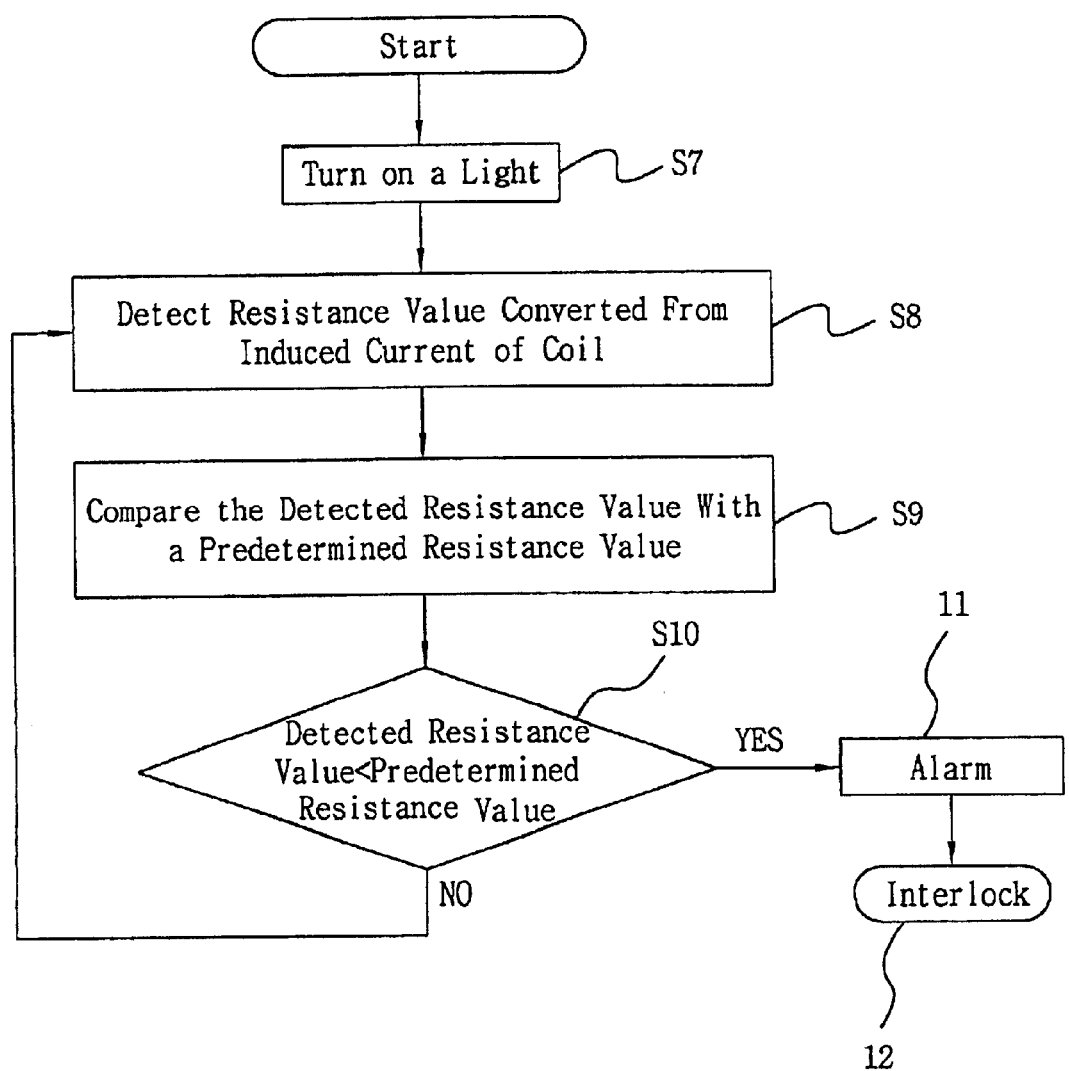
FIG. 5 is a flow chart for controlling the structure shown in FIG. 4.

FIG. 4 shows the structure of another embodiment of an alarm apparatus. The structure in this embodiment is the same as that in the first embodiment in that electric power is supplied to the lamps 20 provided above the dome cover 10 through electric wires 30. However, this second embodiment is different from the first embodiment in that each of the electric wires 30 is provided with a coil 70 winding around one of its two lines. Each of the coils 70 is connected to an electric resistance device 80. Electric current is induced through the coil 70 and the induced current is converted to a resistance value by the resistance device 80. The resistance value is transferred as a signal from the resistance device 80 to the controller 50.

The controller 50 is already provided with a set minimum resistance value as a reference value by which the lamp 20 normally operates, and it compares the detected resistance value with the reference value, thereby determining whether the lamps 20 normally operate. In addition, the controller 50 is provided with alarm 60 so that a worker directly can confirm through the alarm 60 whether the lamps 20 normally operate. The alarm 60 is configured so that a worker directly can view and determine whether each of the lamps 20 normally operates, thereby timely exchanging any defective lamps 20.

It is preferable that the alarm 60 be formed of the same number of LEDs as that of the lamps 20, or the same number of buzzers as that of the lamps 20, or both of them, or the likes.

The confirmation that it is time to exchange one of more lamps 20 is performed as follows.

When semiconductor fabrication processes start, each of the lamps 20 is turned on (S7). At this time, currents flowing through the wires 30 are induced into the coils 70 winding around the wires 30. The induced current flowing in the coil 70 is detected as a resistance value by the resistance device 80 (S8). The resistance value detected by the resistance device 80 is transferred to the controller 50. The controller 50 compares the detected resistance value with the reference value (S9).

If the controller 50 determines that the detected resistance value is less than the reference value, then the controller 50 returns to the step (S8) in which the resistance devices 80 detect the resistance value to thereby compare the detected resistance value with the reference value.

If the controller 50 determines that the detected resistance value is more than the reference resistance value, the controller 50 immediately operates the alarm 60.

It is desirable that the alarm 60 is provided with LEDs so that a worker can directly check the states of the lamps 20 with his own eyes, as in the first embodiment. As a result, if any lamps 20 do not function properly, a worker can confirm the defective lamps through the alarm 60 to thereby timely exchange them.

In addition, if any defective lamp(s) 20 are detected through the alarm 60, the controller 50 immediately interlocks the operation of the semiconductor fabrication equipment so that a worker can timely exchange the defective lamp(s) 20.

It is desirable that if the period the defective lamps 20 are checked, or if the number of the defective lamps 20 are greater than usual, then all of the lamps 20 in the system should be exchanged at a time so that all the exchanged lamps 20 have the same exchange time.

As described above, the defective lamps 20, which radiate an amount of heat less than normal lamps 20, are immediately detected to be exchanged, thereby in advance preventing polymers from being unevenly attached to the dome cover. As a result, contamination of wafers by the polymers that come off from the dome cover can be remarkably prevented, thereby increasing semiconductor fabrication efficiency and reliability in the products.

Particularly, current states of lamps 20 can be easily viewed at the outside during the procedures of semiconductor fabricating processes, thereby the lamps 20 are easily controlled.

While the invention has been described in terms of preferred embodiments, those skilled in the art will recognize that the invention can be practiced with modification within the sprit and scope of the appended claims.

What is claimed is:

1. In a wafer etching apparatus having a reaction chamber including a dome cover, a plurality of lamps provided above the dome cover to uniformly and constantly maintain a temperature of the dome cover, and electric wires supplying electrical power to the lamps, an alarm apparatus for indicating a time to exchange at least one of the lamps, comprising:

current quantity detecting devices provided for each of the electric wires supplying electric power to each of the lamps for detecting amounts of electric current flowing therethrough;

a controller for checking the amounts of electric current through each of the current quantity detecting devices, and comparing the detected amounts of electric current with a predetermined amount of electric current, and an alarm operating in response to a comparison result produced by the controller, for timely indicating a proper exchange time to exchange any of the lamps having an amount of electric current less than the predetermined amount of electric current, wherein the controller stops operation of the wafer etching apparatus if a number of lamps where the amount of electric current flowing therein is less than the predetermined amount of electric current is more than a predetermined number of lamps.

2. The alarm apparatus of claim 1, wherein the alarm is formed of a same number of light emitting diodes as that of the lamps.

* * * * *